United States Patent [19]

Hielbronner

[11] Patent Number: 5,424,919
[45] Date of Patent: Jun. 13, 1995

[54] REPAIRABLE ELECTRONIC CIRCUIT PACKAGE

[75] Inventor: Heinrich Hielbronner, Stein, Germany

[73] Assignee: Export-Contor Aussenhandlesgesellschaft mbH, Nuremberg, Germany

[21] Appl. No.: 210,147

[22] Filed: Mar. 17, 1994

[30] Foreign Application Priority Data

Mar. 31, 1993 [DE] Germany ............ 43 10 446.0

[51] Int. Cl.6 ............................................. H05H 7/20
[52] U.S. Cl. ............................... 361/710; 165/80.3; 165/185; 257/718; 361/715
[58] Field of Search ............... 165/80.3, 185; 174/16.3; 257/718, 719, 726, 727; 361/690, 704, 707–711, 714–718, 722, 735, 790, 749; 439/66–69, 485, 487

[56] References Cited

U.S. PATENT DOCUMENTS

| | | |
|---|---|---|
| 4,636,917 | 1/1987 | Jouanny .............................. 257/719 |
| 4,716,498 | 12/1987 | Ellis ..................................... 361/704 |
| 4,812,949 | 3/1989 | Fontan et al. ...................... 361/386 |
| 4,853,828 | 8/1989 | Penn .................................... 165/185 |
| 5,157,588 | 10/1992 | Kim et al. ........................... 361/396 |

FOREIGN PATENT DOCUMENTS

| | | |
|---|---|---|
| 270069 | 3/1992 | European Pat. Off. . |
| 2614494 | 4/1987 | Germany . |
| 4111247A1 | 4/1991 | Germany . |
| 4122428C2 | 7/1991 | Germany . |

Primary Examiner—Gregory D. Thompson
Attorney, Agent, or Firm—Peter Jon Glück; Morrison Law Firm; Thomas R. Morrison

[57] ABSTRACT

A dismountable, materially separable circuit package is made up by stacking pairs of heat sink, carrier, and bridge components in a back to back fashion. The package is mechanically clamped to form pressure clamped contact of the circuit components. Such piggy-back packaging reduces space requirements by approximately fifty percent. Pressure clamping provides a demountable, repairable structure.

26 Claims, 1 Drawing Sheet

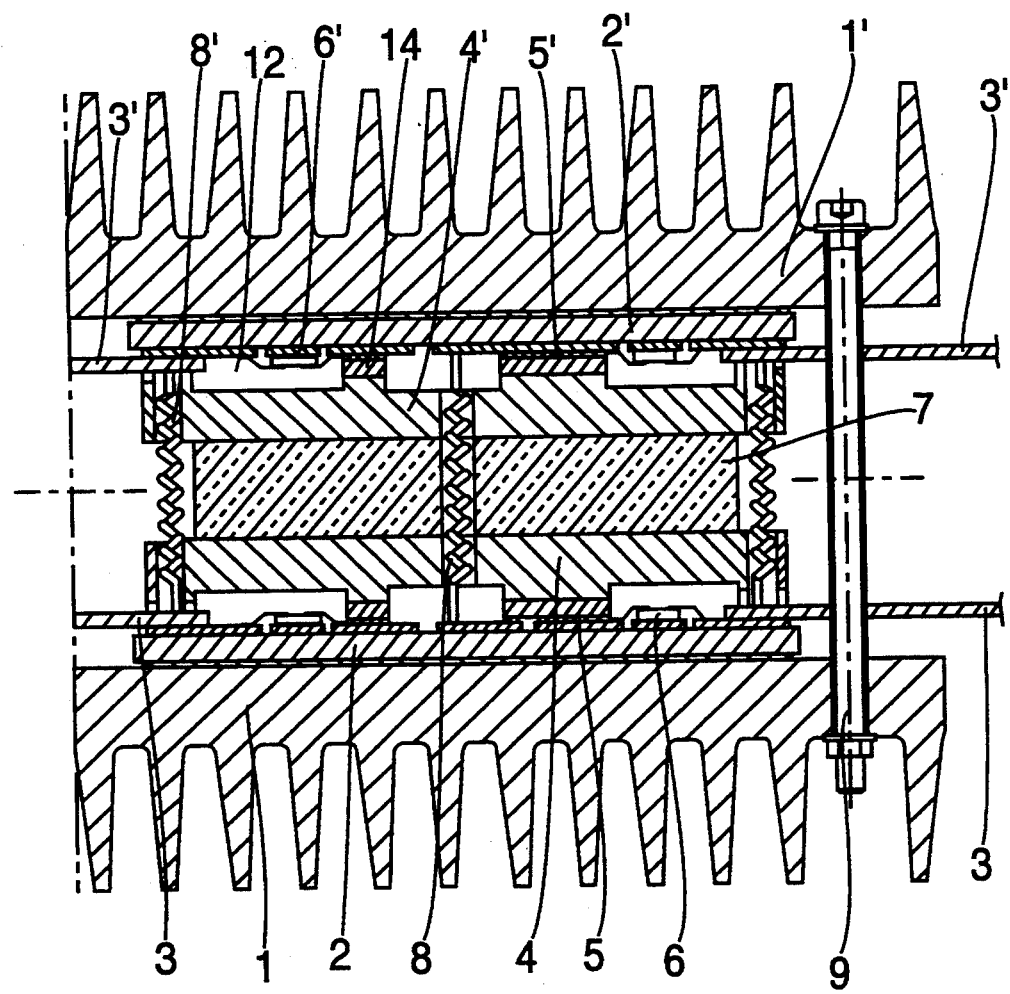

REPAIRABLE ELECTRONIC CIRCUIT PACKAGE

BACKGROUND OF THE INVENTION

The present invention relates to circuit packages, and more particularly to dismountable, materially separable circuit packages.

Although prior art circuit packages for semiconductor components are well known, these disclosed conventional packages have numerous disadvantages. Prominent among these disadvantages are lack of material separability, spatial inefficiency, and power limitations.

The packages disclosed in the literature are neither cost efficient nor thermally and electrically optimal. The German Patent DE 41 11 247 A1, for example, is a circuit package described primarily for power semiconductor applications. As with conventional circuit packages, this patent requires utilization of both semiconductor cooling and mounting components. These components, however, inherently require a significant amount of space. Accordingly, the dimensions of these components primarily dictate spatial requirements of these circuit packages and significantly limit the overall density of the circuit package.

The prior art also discloses a multiple level circuit package for improved semiconductor packaging density. In U.S. Pat. No. 5,157,588 (hereinafter "the '588 Patent"), for example, the package generally shows carrier components with heat sink components arranged in mirror-image fashion above each other.

While this package does promote greater circuit density, the package has limited application beyond semiconductor packaging. One such limitation is the inability to replace individual components. A material feature of any circuit package is the accessibility of the individual components for replacement. Since this package requires a static physical structure, once assembled, the circuit is neither dismountable nor materially separable for component replacement.

The circuit package of French Patent FR 2 614 494 A1 is limited in application for the same reason. This patent discloses a multiple layer circuit package electrically interconnected by means of contact springs. This patent, as with the '588 Patent, discloses a higher density circuit package by means of a static structure. Accordingly, component replacement is not pragmatically achievable with this circuit package. Thus, it is apparent that the devices of the prior art have not adequately addressed longstanding spatial efficiency and accessability issues.

OBJECTS AND SUMMARY OF THE INVENTION

Accordingly, it is an object of the present invention to provide a dismountable, materially separable, thermally and spatially optimal layout of a circuit package that works reliably without limiting its power.

It is a further object of the present invention to provide a circuit package that overcomes drawbacks of the prior art.

It is still a further object of the invention to provide a circuit package that provides a high degree of reliability even at high power levels.

The present invention addresses the enumerated shortcomings and teaches that by means of a two-level package, the spatial requirements can be reduced by approximately fifty percent. Moveover, the present invention uses a novel hybrid structure for overcoming drawbacks of conventional circuit packages in terms of material separability and power limitations, inter alia.

This is shown by a preferred embodiment of the present invention, in which the mounting component of DE 41 11 247 A1 is replaced by at least one additional back to back package. This back to back package performs the mechanical function of the mounting component of the prior art. Electrical connections are made by one or both of contact springs and printed circuit boards.

This is further demonstrated by the connections to the external terminals, which are of a flat design (printed circuit boards or ribbon strands, for example). The external terminals are clamped to the carrier component by the application of pressure. The package of the present invention is separably connected and fixed by mechanical clamping components (screws, for example) so that a circuit package of high spatial density is produced. Even at high power, the present invention provides a high degree of reliability.

The circuit package has heat sink components and at least two carrier and bridge components. Pressure contact between the respective carrier and bridge components is achieved through pressing back to back circuits against each other using clamping components. The resilience of resilient cushion maintains the required contact clamping pressure. The circuit specific electrical interconnections are achieved by one or both of contact springs and printed circuit boards.

According to an embodiment of the invention, there is provided a repairable electronic circuit package comprising: first and second carrier components; first and second heat sink components; first and second bridge components; and means for urging.

The first and second carrier components have means for receiving semiconductor components and contact surfaces. The first and second heat sink components are in contact with their respective carrier components. The first and second bridge components, each have circuit specific webs which are positioned facing the corresponding contacts on the respective carrier component, as is conventionally known, such webs include respective top and bottom layers ensuring electrical contact with surfaces adjacent thereto. The bridge components are disposed back to back of each other.

Clamping contact is achieve by the means of urging. Each heat sink component is urged toward each other, whereby contact is made between each said heat sink component and its respective carrier component and between the contact surfaces on each carrier component and the webs on the respective bridge component.

Alternate preferred embodiments of the present invention include means for providing electrical interconnection between the first and second carrier components and connection of each carrier component with an external circuit.

The above, and other objects, features, and advantages of the present invention will become apparent from the following description read in conjunction with the accompanying drawings, in which like reference numerals designate the same components.

BRIEF DESCRIPTION OF THE DRAWINGS

FIG. 1 is a cross-sectional view of the circuit package preferred embodiment, according to the present invention. This figure is not drawn to scale.

DETAILED DESCRIPTION OF THE PREFERRED EMBODIMENT

Referring now to FIG. 1, there is shown a cross-sectional view of the circuit package preferred embodiment, according to the present invention. This figure is not drawn to scale.

Carrier components 2, 2', are each placed onto heat sink components 1, 1' in accordance with the present invention. For better heat transfer, one of carrier components 2, 2', or heat sinks 1, 1' has been previously coated with a heat-conductive paste. It is preferable when the carrier components consist, for example, of ceramic bodies that have been bonded on both sides with copper and provided with all necessary component contacts. The internal connections on the carrier are be made, for example, by means of wire bonding. In FIG. 1, for example, power semiconductor components 6, 6' are mounted on their respective carrier components.

A preferred embodiment of the present invention is adapted to use an external connection, such as printed circuit board 3, 3', which is attached to the carrier component and adjusted. The external connection itself is designed with recesses, openings, and such contours which allow it to fit accurately into position on the carrier component. The carrier component, according to this embodiment, is laminated. This is done with one or more layers of conductive strips in predetermined places, in any of a plurality of ways convenient and conventionally known. These conductive strips are in the form of one of flexible printed circuit boards, stampings of electrically conductive metal, or ribbon strands. The printed circuit boards are provided with direct or indirect socket connectors for external contacting or wiring on the external printed circuit board ends.

Pressure contact of the circuit package is achieved by bridge components 4, 4'. This is further enhanced with cavities 12, webs 14, and metallizations 5, 5' for the electrical contact of individual circuit components. Shape and contours of the bridge components 4, 4' are adapted to the actual circuit package in such a way that when pressure is applied, a good ohmic contact is produced with all contact points necessary for the circuitry. These contacts provide a path for heat dissipation from the bridge components 4, 4' to the heat sink components 1, 1'.

A preferred embodiment of the present invention is adopted to use a resilient cushion component 7, positioned between the bridge components 4, 4' for pressure compensation. The physical dimensions of the resilient cushion are according to the mechanical design requirements of the corresponding package.

The first and second circuits comprise bridge components 4, 4', carrier components 2, 2', and heat sinks 1, 1', respectively. The package is assembled, in a sequence determined by the specific layout.

Depending on the circuitry, the second circuit is an exact copy of the first circuit or is an alternate structure composed of different components. The corresponding design determines the particular mechanical aspects of the package.

The package, according to this embodiment of the invention, is adopted for electrical interconnection between the first and second circuits, by contact springs 8, 8', fed through corresponding lead-throughs of the cushion component 7 and the bridge components 4, 4'. These lead-throughs are aligned, whereby positioning the contact springs onto the contact areas of the semiconductor components, carrier components, or printed circuit boards.

A uniform pressure contact is established and fixed for the circuit by means of clamping components 9. Clamping components can be any convenient or known devices. Screw fittings in the corresponding lead-throughs of the heat sinks tighten to a predetermined pressure, is an example.

Having described the preferred embodiment of the invention with reference to the accompanying drawing, it is to be understood that the invention is not limited to this precise embodiment, and that various changes and modifications may be effected therein by one skilled in the art without departing from the scope or spirit of the invention as defined in the appended claims.

What is claimed is:

1. A circuit package, comprising:
    first and second carrier components (2, 2'); at least one of said first and second carrier components including means for receiving at least one semiconductor component (6, 6');
    said means being disposed to align said at least one semiconductor component in a specific position relative to, and adjacent with, said at least one first and second carrier components;
    said means electrocondutively connected with said at least one semiconductor component and said at least one first and second carrier components;
    first and second heat sink components (1, 1') in contact with said first and second carrier components, respectively;
    first and second bridge components (4, 4') each having at least one web, each said at least one web arranged such that each of said at least one webs faces its respective carrier component;
    said first and second bridge components are arranged in mirror image and separably connected by means for urging;
    said means for urging said first and said second heat sink components toward each other, whereby clamping contact between said first heat sink component and said first carrier component, and said second heat sink component and said second carrier component, is achieved.

2. Apparatus according to claim 1, further comprising:
    said first carrier component having at least a first circuit thereon;
    said second carrier component having at least a second circuit thereon; and,
    compressible electrical conductors, interconnecting said first circuit and said second circuit.

3. Apparatus according to claim 1, further comprising:
    means for providing a thermal conductive path from at least one of said webs to at least one of said carrier components, whereby a heat path from at least one of said bridge components to at least one of said heat sink components is provided;
    said means further comprising contact springs.

4. Apparatus according to claim 1, further comprising:
    at least one of said webs including a top and a bottom electroconductive layer, said web having a first electrical conductor thereon facing its respective said carrier component;

said carrier component having a second electrical conductor thereon; and said first and second electrical conductors being brought into contact with each other by said means for urging.

5. Apparatus according to claim 1, further comprising resilient means between said first and second bridge components.

6. Apparatus according to claim 5, wherein said resilient means includes a resilient cushion.

7. Apparatus according to claim 5, wherein said resilient cushion includes at least one hole for permitting the passage of a conductor therethrough between said first and second carrier components.

8. Apparatus according to claim 7, wherein said first and second bridge components each includes at least one hole therein aligned with said hole in said resilient cushion.

9. Apparatus according to claim 1, wherein said means for urging includes at least one screw through said first and second heat sink components.

10. Apparatus according to claim 1, further comprising:

means for externally connecting to at least one of said first and second carrier components;

said means for externally connecting is a printed circuit board having at least one conductor printed thereon; and said means for urging including means for clamping said means for externally connecting, with at least one said conductor in electrical contact with its respective said carrier component.

11. A circuit package, comprising:

first and second carrier components (2, 2'), arranged in substantially parallel relation;

at least one of said carrier components including means for receiving at least one semiconductor component (6, 6');

said means being disposed to align said at least one semiconductor component in a specific position relative to, and adjacent with, said at least one first and second carrier components;

said means electroconductively connected with said at least one semiconductor component and said at least one first and second carrier components;

first and second heat sink components (1, 1'), in contact with the outer side of each said first and said second carrier components, respectively;

first and second bridge components (4, 4'), each having a pattern of webs matching each said contact surfaces on each said respective carrier component, arranged such that said webs rice the inner side of each said first and second carrier components, respectively;

said components forming first and second circuits (3, 3'), wherein said circuits are stacked back to back, whereby said first bridge component is adjacent with said second circuit and said second bridge component is adjacent with said first bridge component;

means for electrically interconnecting said first circuit with said second circuit;

said means for electrically interconnecting including at least one compressible resilient element contacting said first and second circuits;

means for providing external connection to said first and second circuits;

said at least one compressible resilient element being a resilient cushion, disposed between said first and second bridge components;

means for mechanically clamping said tint circuit mutually with said second circuit, whereby each said web forms a pressure contact of each said carrier component with each said semiconductor component and with said means for providing external connection.

12. Apparatus according to claim 11, further comprising a resilient cushion clamped between said first and said second circuits.

13. Apparatus according to claim 12, wherein said resilient cushion further comprises:

at least one aligned lead-through for said compressible resilient element.

14. Apparatus according to claim 13, wherein said first and second bridge components each includes a lead-through aligned with said lead-through in said resilient cushion.

15. Apparatus according to claim 11, wherein said means for mechanically clamping includes a clamping element having at least one lead-through in each of said first and second heat sink components for receiving a screw.

16. Apparatus according to claim 11, wherein said bridge components include metallization for electrically contacting each said received semiconductor component with each said carrier component and said means for providing external connection.

17. Apparatus according to claim 11, wherein each said means for providing external connection includes at least one printed circuit board.

18. Apparatus according to claim 11, wherein said means for electrically interconnecting includes at least one spring contact.

19. A circuit package, comprising:

first and second carrier components (2, 2') including means for receiving at least one semiconductor component and at least one contact surface to be cooled;

first and second heat sink components (1, 1'), in contact with said first and said second carrier components, respectively;

first and second bridge components (4, 4'), each having at least one web, arranged such that each said at least one web faces said first and said second carrier components, respectively;

each said component being electroconductively connected with, and forming first and second circuits, wherein said circuits are stacked on each other in a back to back fashion and whereby said bridge components are adjacent to each other;

means for externally connecting to each said circuit; and means for mechanically clamping said first circuit mutually with said second circuit whereby each said web forms a clamped contact of said carrier component with said received semiconductor and said means for externally connecting.

20. Apparatus according to claim 19, further comprising a resilient cushion clamped between said first and second circuits.

21. Apparatus according to claim 19, wherein said means for mechanically clamping means includes said first and second heat sink components with at least one lead-through for adjustment and pressure contact.

22. Apparatus according to claim 19, wherein said means for mechanically clamping includes at least one screw.

23. Apparatus according to claim 19, wherein said bridge components include metallization for electrically contacting said received semiconductor with said carrier component and said means for externally connecting.

24. Apparatus according to claim 19, wherein each said means for externally connecting is at least one printed circuit board.

25. Repairable Electronic Circuit Package, which comprises:
- a first bridge component (4);
- a first carrier component (2);
- said first carrier component (2) being in face to face contact with said first bridge component (4);
- a second bridge component (4');
- a second carrier component (2');
- said second bridge component (4') being in face to face contact with said second carrier component (2');
- said first bridge component (4) being in mirror image relationship to said second bridge component (4'); and
- means for applying clamping force to said first and second carrier components, whereby said circuit package is clamped together; said repairable electronic circuit package further comprising resilient means between said first and second bridge components.

26. Repairable Electronic Circuit Package, which comprises:
- a first bridge component (4);
- a first carrier component (2);
- said first carrier component (2) being in face to face contact with said first bridge component (4);
- a second bridge component (4');
- a second carrier component (2');
- said second bridge component (4') being in face to face contact with said second carrier component (2');
- said first bridge component (4) being in mirror image relationship to said second bridge component (4'); and
- means for applying clamping force to said first and second carrier components, whereby said circuit package is clamped together;
- said repairable electronic circuit package further comprising:
- a first heat sink component (7) outward of said first carrier component (2);
- a second heat sink component (7') outward of said second carrier component (2'); and
- said means for applying clamping force further including means for applying inward clamping force on each said first (7) and said second (7') heat sink components.

* * * * *